(12) United States Patent
Guard

(10) Patent No.: US 9,154,127 B2
(45) Date of Patent: Oct. 6, 2015

(54) TOUCH SENSOR WITH CONDUCTIVE LINES HAVING PORTIONS WITH DIFFERENT WIDTHS

(75) Inventor: David Brent Guard, Southampton (GB)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/413,306

(22) Filed: Mar. 6, 2012

(65) Prior Publication Data

US 2013/0234974 A1   Sep. 12, 2013

(51) Int. Cl.
*G06F 3/044* (2006.01)
*H03K 17/96* (2006.01)

(52) U.S. Cl.
CPC .......... *H03K 17/9622* (2013.01); *G06F 3/044* (2013.01); *G06F 2203/04112* (2013.01); *H03K 2017/9602* (2013.01); *H03K 2217/96015* (2013.01); *H03K 2217/96031* (2013.01)

(58) Field of Classification Search
CPC ......... G01R 27/26; G06F 3/041; G06F 3/044; G06F 3/045; G06F 2203/04112; B32B 37/00; H03K 17/9622; H03K 2017/9602; H03K 2217/96015; H03K 2217/96031
USPC ......... 345/173, 174; 178/18.06; 324/660, 658
See application file for complete search history.

(56) References Cited

U.S. PATENT DOCUMENTS

| | | | |
|---|---|---|---|
| 6,924,789 B2 | 8/2005 | Bick | |
| 7,382,139 B2 * | 6/2008 | Mackey | 324/660 |
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang et al. | |
| 8,355,006 B2 | 1/2013 | Park et al. | |
| 8,456,444 B2 | 6/2013 | Ishizaki et al. | |
| 8,723,824 B2 | 5/2014 | Myers | |
| 8,797,285 B2 | 8/2014 | Guard et al. | |
| 2002/0167619 A1 | 11/2002 | Bietsch et al. | |
| 2004/0239650 A1 | 12/2004 | Mackey | |
| 2006/0097991 A1 | 5/2006 | Hotelling et al. | |
| 2008/0158183 A1 | 7/2008 | Hotelling et al. | |
| 2008/0309635 A1 | 12/2008 | Matsuo | |
| 2009/0205879 A1 * | 8/2009 | Halsey, IV et al. | 178/18.06 |

(Continued)

FOREIGN PATENT DOCUMENTS

WO   WO 2012/129247   9/2012

OTHER PUBLICATIONS

Guard et al., U.S. Appl. No. 13/331,022, filed Dec. 20, 2011, (22 pgs.).

(Continued)

*Primary Examiner* — Lun-Yi Lao
*Assistant Examiner* — Johny Lau
(74) *Attorney, Agent, or Firm* — Baker Botts L.L.P.

(57) ABSTRACT

In one embodiment, a touch sensor includes a first mesh of conductive material. The first mesh includes a plurality of conductive lines. A first one of the conductive lines has a first portion and a second portion. The first portion is wider than the second portion. The first portion defines a first portion of a first outer edge of an electrode.

14 Claims, 4 Drawing Sheets

(56) References Cited

U.S. PATENT DOCUMENTS

| | | |
|---|---|---|
| 2009/0219257 A1 | 9/2009 | Frey et al. |
| 2009/0273570 A1 | 11/2009 | Degner et al. |
| 2009/0315854 A1* | 12/2009 | Matsuo .................. 345/174 |
| 2010/0026664 A1* | 2/2010 | Geaghan ................ 345/174 |
| 2010/0045614 A1* | 2/2010 | Gray et al. ............. 345/173 |
| 2010/0045615 A1 | 2/2010 | Gray et al. |
| 2010/0045632 A1 | 2/2010 | Yilmaz et al. |
| 2010/0302201 A1 | 12/2010 | Ritter et al. |
| 2011/0007020 A1 | 1/2011 | Hong et al. |
| 2011/0018557 A1* | 1/2011 | Badaye .................. 324/658 |
| 2011/0310033 A1 | 12/2011 | Liu et al. |
| 2011/0310037 A1 | 12/2011 | Moran et al. |
| 2012/0075238 A1* | 3/2012 | Minami et al. ......... 345/174 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2012/0261242 A1 | 10/2012 | Guard et al. |
| 2012/0262382 A1 | 10/2012 | Guard et al. |
| 2012/0262412 A1 | 10/2012 | Guard et al. |
| 2013/0076612 A1 | 3/2013 | Myers |
| 2013/0127772 A1 | 5/2013 | Guard et al. |

OTHER PUBLICATIONS

Guard et al., U.S. Appl. No. 13/089,061, filed Apr. 18, 2011, (35 pgs.).
Guard et al., U.S. Appl. No. 13/347,859, filed Jan. 11, 2012, (34 pgs.).
U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.
Guard et al., U.S. Appl. No. 13/312,405, Final Rejection, Mar. 6, 2014.
Guard et al., U.S. Appl. No. 13/347,859, Notice of Appeal, Jan. 31, 2014.
Guard et al., U.S. Appl. No. 13/347,859, Applicant-Initiated Interview Summary, Feb. 6, 2014.
Guard et al., U.S. Appl. No. 13/347,859, Applicant Summary of Interview with Examiner, Mar. 10, 2014.
Guard et al., U.S. Appl. No. 13/089,061, Non-final Office Action, Nov. 23, 2012.
Guard et al., U.S. Appl. No. 13/089,061, Response to Non-final Office Action, Mar. 25, 2013.
Guard et al., U.S. Appl. No. 13/089,061, Non-final Office Action, Jun. 20, 2013.
Guard et al., U.S. Appl. No. 13/089,061, Response to Non-final Office Action, Dec. 17, 2013.
Guard et al., U.S. Appl. No. 13/331,022, Non-final Office Action, Oct. 7, 2013.
Guard et al., U.S. Appl. No. 13/331,022, Response Non-final Office Action, Jan. 7, 2014.
Guard et al., U.S. Appl. No. 13/312,405, Non-final Office Action, Jul. 19, 2013.
Guard et al., U.S. Appl. No. 13/312,405, Response to Non-final Office Action, Dec. 18, 2013.
Guard et al., U.S. Appl. No. 13/347,859, Non-final Office Action, Nov. 2, 2012.
Guard et al., U.S. Appl. No. 13/347,859, Response to Non-final Office Action, Mar. 4, 2013.
Guard et al., U.S. Appl. No. 13/347,859, Final Office Action, May 21, 2013.
Guard et al., U.S. Appl. No. 13/347,859, Request for Continued Examination and Response, Sep. 20, 2013.
Guard et al., U.S. Appl. No. 13/347,859, Non-final Office Action, Nov. 1, 2013.
David B. Guard, U.S. Appl. No. 13/331,022, Final Office Action, dated Apr. 15, 2014.
David B. Guard, U.S. Appl. No. 13/331,022, Request for Continued Examination, dated Jul. 15, 2014.
David B. Guard, U.S. Appl. No. 13/331,022, Non-final Office Action, dated Sep. 15, 2014.
David B. Guard, U.S. Appl. No. 13/331,022, Response filed Feb. 17, 2015.

* cited by examiner

TOUCH SENSOR WITH CONDUCTIVE LINES HAVING PORTIONS WITH DIFFERENT WIDTHS

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
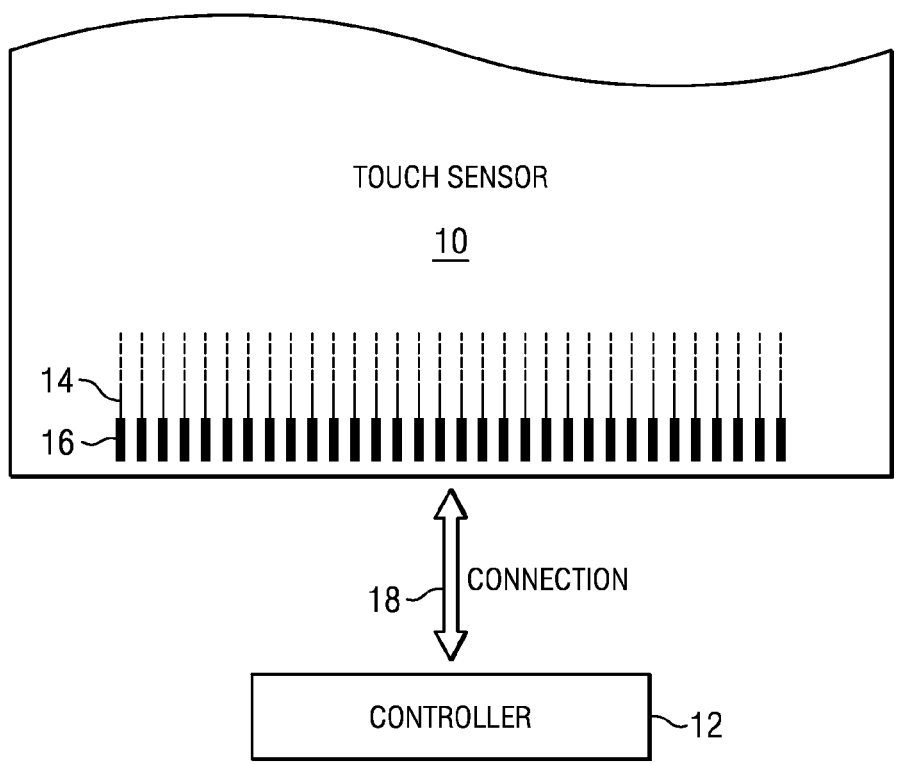
FIG. 1 illustrates an example touch sensor 10 with an example touch-sensor controller 12.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs) or digital signal processors (DSPs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be inserted into an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
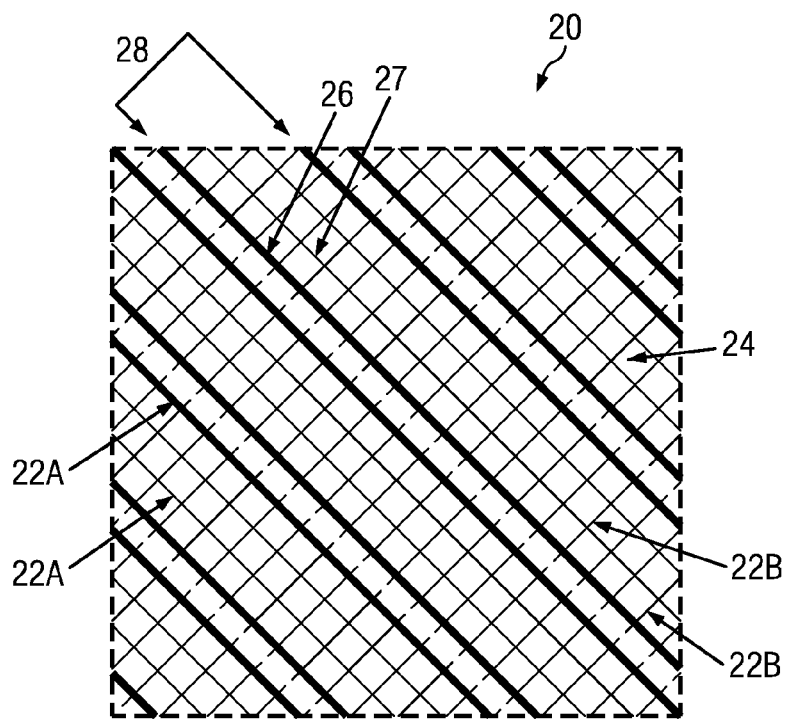
FIGS. 2A-2C illustrate three example mesh patterns of a touch-sensitive mesh layer.
Figure 2B:
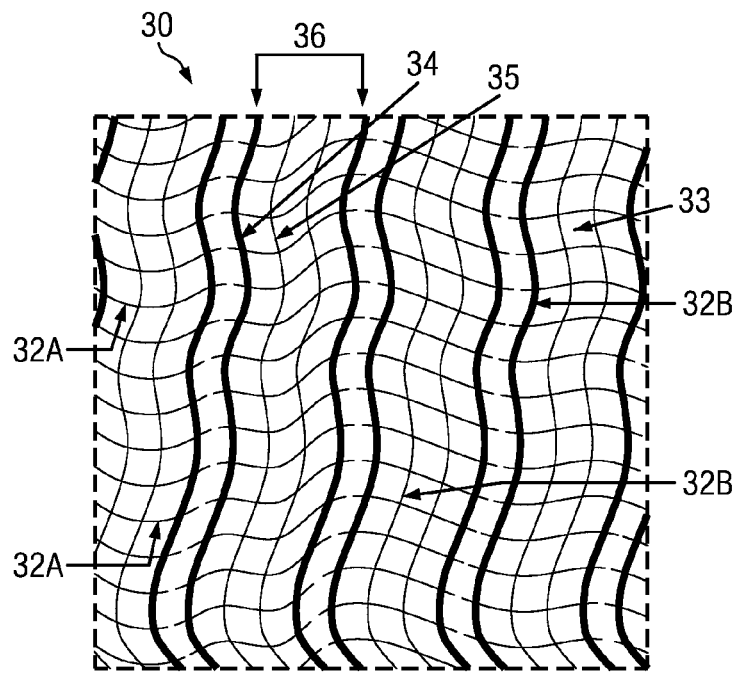
Figure 2C:
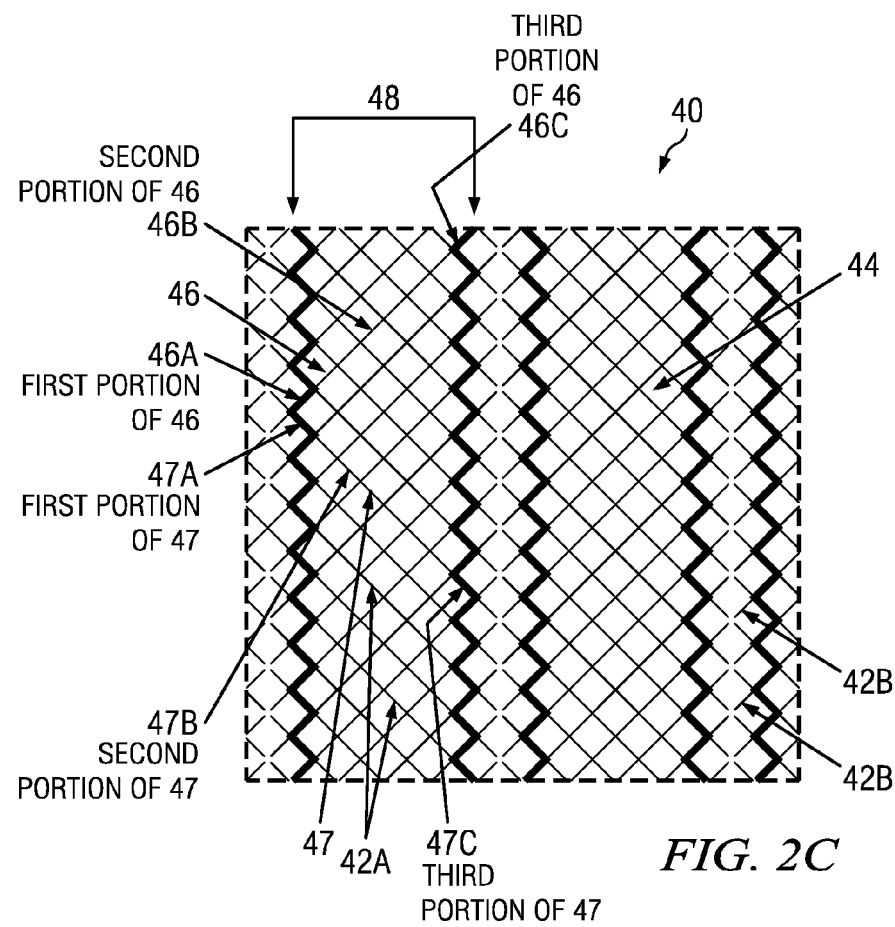

FIGS. 2A-2C illustrate three example mesh patterns of a touch-sensitive mesh layer. As discussed above, an electrode may be made of fine lines 22A-B of metal or other conductive material (e.g., copper, silver, or a copper- or silver-based material) and the lines 22A-B of conductive material may occupy the area of the electrode shape in a hatched, mesh, or other suitable pattern. In the example of FIG. 2A, an example mesh pattern 20 of a touch-sensitive mesh layer is formed from substantially straight lines 22A-B of conductive material. Mesh pattern 20 may be formed using two sets 22A-B of substantially parallel lines of conductive material. Mesh pattern 20 may be made up of an array of polygon-shaped mesh cells 24 formed from substantially orthogonal intersections between lines 22A with lines 22B of conductive material. As an example and not by way of limitation, first set 22A and second set 22B of conducting lines may be disposed such that a total line density is less than approximately 10% of a surface area. Thus, the contribution of the conductive lines to the reduction of transmission of light through mesh pattern 20 may be less than approximately 10%. In particular embodiments, the conductive lines may result in an attenuation of, for example, 3-10% of the transmission of light through mesh pattern 20.

In the example of FIG. 2A, example mesh pattern 20 of a touch-sensitive mesh layer further includes one or more conductive lines 22A-B that have a width that is greater than a width of one or more other conductive lines 22A-B. As an example and not by way of limitation, mesh pattern 20 may include a conductive line 26 and a conductive line 27 (which are examples of two of conductive lines 22A-B). Conductive line 26 may have a width that is greater than the width of conductive line 27. In particular embodiments, conductive line 27 may have any width that is less than the width of conductive line 26. As an example and not by way of limitation, if the width of conductive line 26 is 5 μm, conductive line 27 may have any width that is less than 5 μm, such as 4 μm, 3 μm, 2 μm, or any other width that is less than 5 μm. In particular embodiments, because conductive line 27 has a width that is less than the width of conductive line 26, the total line density of example mesh pattern 20 may be reduced. As such, the reduced width of conductive line 27 may increase the transmittance in a device utilizing example mesh pattern 20.

In the example of FIG. 2A, example mesh pattern 20 of a touch-sensitive mesh layer further includes one or more electrodes, such as, for example, electrode 28. In particular embodiments, electrode 28 may include a plurality of conductive lines 22A-B. Furthermore, in particular embodiments, one or more of the conductive lines 22A-B may be primary conductive lines while one or more of the conductive lines 22A-B may be secondary conductive lines. In particular embodiments, the width of the secondary conductive lines may be less than that of the primary conductive lines. As an example and not by way of limitation, conductive line 26 (which may have a width that is greater than that of conductive line 27) may be a primary conductive line, while conductive line 27 may be a secondary conductive line. In particular embodiments, since the primary conductive lines have a greater width than that of the secondary conductive lines, if one or more of the secondary conductive lines break (or are otherwise unable to carry an alternating voltage or charge), the primary conductive lines and the remaining secondary conductive lines may still carry the alternating voltage applied to a drive electrode or the charge induced on a sense electrode. As such, the primary conductive lines and remaining secondary conductive lines may still provide a suitable level of electrical connectivity across mesh pattern 20. Electrode 28 may have any suitable pattern for the primary conductive lines and secondary conductive lines. As an example and not by way of limitation, the primary conductive lines of electrode 28 may be the outermost conductive lines of electrode 28, while the secondary conductive lines of electrode 28 may be the innermost conductive lines of electrode 28.

Although this disclosure describes or illustrates particular mesh patterns, this disclosure contemplates any suitable mesh pattern formed using conductive lines with any suitable configuration. As an example and not by way of limitation, a mesh pattern may include any particular pattern of conductive lines, any particular pattern of primary conductive lines, any particular pattern of secondary conductive lines, and any particular pattern of electrodes.

In the example of FIG. 2B, mesh pattern 30 is formed from conductive lines 32A-B which are not substantially straight. Non-straight line patterns 32A-B may be used to reduce the likelihood of the metal line patterns causing interference or moiré patterns. The non-straight pattern of the conductive lines 32A-B of mesh pattern 30 may disperse—and hence reduce—the visibility of reflections from conductive lines 32A-B when illuminated by incident light. As an example and not by way of limitation, each of conductive lines 32A-B of mesh pattern 30 may have a substantially wavy, or sinusoidal, shape, as shown in FIG. 2B. Mesh pattern 30 may be made up of an array of mesh cells 33 formed from intersections between lines 32A with lines 32B of conductive material.

In the example of FIG. 2B, example mesh pattern 30 of a touch-sensitive mesh layer further includes one or more conductive lines 32A-B that have a width that is greater than a width of one or more other conductive lines 32A-B (such as conductive line 34 having a greater width than the width of conductive line 35). Mesh pattern 30 further includes one or more electrodes, such as, for example, electrode 36. Furthermore, the electrodes of mesh pattern 30 may have primary conductive lines and secondary conductive lines, where the primary conductive lines (such as, for example, conductive line 34) have a width that is greater than the width of the secondary conductive lines (such as, for example, conductive line 35).

Although this disclosure describes or illustrates particular mesh patterns, this disclosure contemplates any suitable mesh pattern formed using conductive lines with any suitable configuration. As an example and not by way of limitation, a mesh pattern may include any particular pattern of conductive lines, any particular pattern of primary conductive lines, any particular pattern of secondary conductive lines, and any particular pattern of electrodes.

In the example of FIG. 2C, mesh pattern 40 is formed from conductive lines 42A-B which are substantially straight. Mesh pattern 40 may be made up of an array of mesh cells 44 formed from intersections between lines 42A with lines 42B of conductive material.

In the example of FIG. 2C, example mesh pattern 40 of a touch-sensitive mesh layer further includes one or more conductive lines 42A-B that have at least one portion with a width that is greater than a width at least one other portion of the same conductive line 42A-B. As an example and not by way of limitation, mesh pattern 40 may include a conductive line 46 and a conductive line 47 (which are examples of two of conductive lines 42A-B). Conductive lines 46 and 47 each include three portions: a first portion (such as first portions 46A and 47A), a second portion (such as second portions 46B and 47B), and a third portion (such as third portions 46C and 47C). First portions 46A and 47A and third portions 46C and 47C may each have widths (not necessarily equal to each other) that are greater than the width of each of second portions 46B and 47B.

As an example and not by way of limitation, if the width of each of first portions 46A and 47A and third portions 46C and 47C is 5 µm, second portions 46B and 47B may each have any width that is less than 5 µm, such as 4 µm, 3 µm, 2 µm, or any other width that is less than 5 µm. As another example and not by way of limitation, if the width of each of first portions 46A and 47A and third portions 46C and 47C is 3 µm, second portions 46B and 47B may each have any width that is less than 3 µm, such as 2 µm, or any other width that is less than 3 µm. In particular embodiments, because the width of each of second portions 46B and 47B may be less than the width of each of first portions 46A and 47A and third portions 46C and 47C, the total line density of example mesh pattern 40 may be reduced. As such, the reduced width of second portions 46B and 47B may increase the transmittance in a device utilizing example mesh pattern 40.

In the example of FIG. 2C, example mesh pattern 40 of a touch-sensitive mesh layer further includes one or more electrodes, such as, for example, electrode 48. In particular embodiments, electrode 48 may include a plurality of conductive lines 42A-B. Furthermore, in particular embodiments, the first portions of conductive lines 42A-B and third portions of conductive lines 42A-B may define a portion of each of the outer edges of the electrodes. As an example and not by way of limitation, first portion 46A may define a first portion of a first outer edge of electrode 48 and first portion 47A may define a second portion of the first outer edge of electrode 48. As another example and not by way of limitation, third portion 46C may define a first portion of a second outer edge of electrode 48 and third portion 47C may define a second portion of the second outer edge of electrode 48. The outer edges of the electrodes, such as electrode 48, may be the edges that define the shape of each electrode and/or the main area of each electrode.

In particular embodiments, the outer edges of the electrodes may be primary conductive areas while the inner portions of the electrodes (such as the inner portions made up of second portions of conductive lines 42A-B) may be secondary conductive areas. In particular embodiments, since the primary conductive areas have a greater width than that of the secondary conductive areas, if one or more portions of the secondary conductive areas break (or are otherwise unable to carry an alternating voltage or charge), the primary conductive areas and the remaining portions of the secondary conductive areas may still carry the alternating voltage applied to a drive electrode or the charge induced on a sense electrode. As such, the primary conductive areas and remaining portions of secondary conductive areas may still provide a suitable level of electrical connectivity across mesh pattern 40. Electrode 48 may have any suitable pattern for the primary conductive areas and secondary conductive areas.

According to the illustrated embodiment, portions of conductive lines 42A-B may be cut in-between electrodes, such as electrode 48. These cut portions of conductive lines 42A-B may be boundary separation lines that separate an electrode from an adjacent electrode. Furthermore, these cut portions may also form each electrode. Although this disclosure describes or illustrates conductive lines 42A-B as having portions in-between each electrode that have been cut (e.g., thus forming each electrode), conductive lines 42A-B need not have been cut in order to form the electrodes. As an example and not by way of limitation, one or more of the electrodes may be printed (or otherwise formed) on a substrate in a manner that does not require any cuts to be made in order to form the electrodes. In such an example, there need not be any portions of conductive lines 42A-B in-between each electrode and/or the portions of conductive lines 42A-B in-between each electrode may be reduced in size.

Furthermore, although this disclosure describes or illustrates particular mesh patterns, this disclosure contemplates any suitable mesh pattern formed using conductive lines with any suitable configuration. As an example and not by way of limitation, a mesh pattern may include any particular pattern of conductive lines, any particular pattern of portions of conductive lines, any particular pattern of primary conductive areas, any particular pattern of secondary conductive areas, and any particular pattern of electrodes.

Additionally, although this disclosure describes or illustrates conductive lines 42A-B as being substantially straight, conductive lines 42A-B may have any other shape. As an example and not by way of limitation, conductive lines 42A-B may be not substantially straight. Additionally, although this disclosure describes or illustrates the electrodes, such as electrode 48, as including two outermost edges, the electrodes may have any number of outermost edges. As an example and not by way of limitation, the electrodes may have only one outermost edge. As other examples and not by way of limitation, the electrodes may have three outermost edges, four outermost edges, or any other number of outermost edges.

Figure 3:
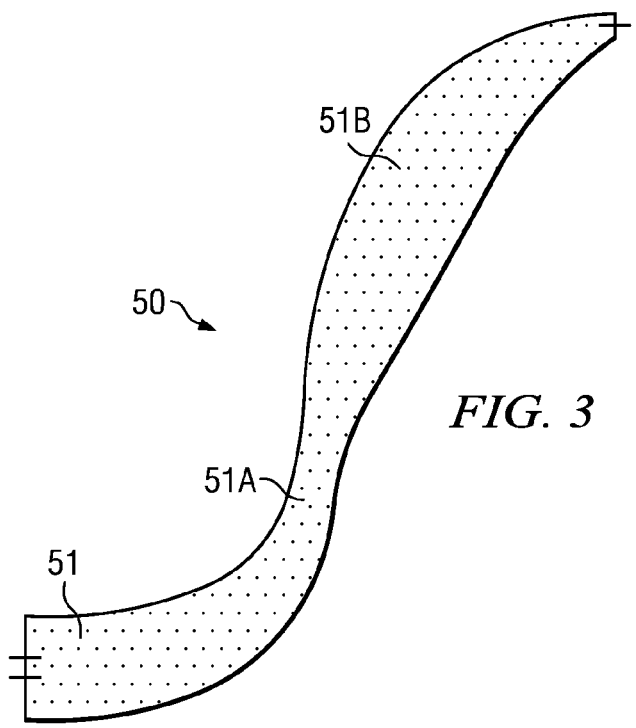
FIG. 3 illustrates a portion of an example electrode pattern.

FIG. 3 illustrates a portion of an example electrode pattern 50. In this example, the electrode pattern 50 includes a conductive line 51 that is not substantially straight. The conductive line 51 includes narrow portions 51A and broader portions 51B. The conductive line 51 may have a tapering width between the narrow portions 51A and broader portions 51B. In other examples, the width can vary non-linearly along the length of the conductive line 51.

Figure 4:
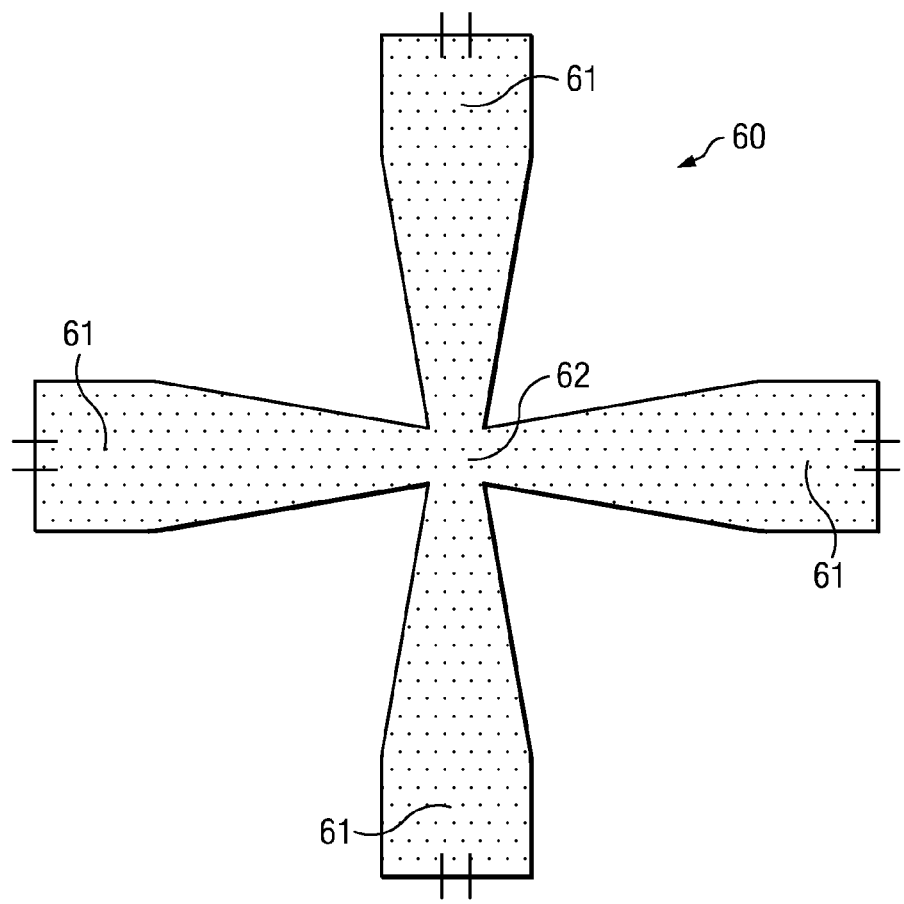
FIG. 4 illustrates a portion of another example electrode pattern.

FIG. 4 illustrates a portion of another example electrode pattern 60. In this illustrated example, the electrode pattern 60 is formed by conductive lines 61 arranged to interconnect at a connection point 62 to define a conductive grid or mesh pattern made up of an array of mesh cells. The connection point 62 of the conductive lines 61 forms a vertex of four of the shapes. In FIG. 4, a single connection point 62 is shown, together with parts of the conductive lines 61 which interconnect at the connection point 62.

In FIG. 4, each of the four conductive lines 61 are relatively narrow at the connection point 62, and relatively broad away from the connection point 62. Each of the conductive lines 61 may have a tapered section which widens in a direction extending away from the connection point 62.

The examples shown in FIG. 3 and FIG. 4 may be combined. For example, the conductive lines may vary in width along their length and may be relatively narrow where the conductive lines interconnect at a connection point.

In the examples of FIG. 3 and FIG. 4, the conductive lines are not substantially straight. However, the conductive lines could have other shapes. As an example and not by way of limitation, the conductive lines which vary in width along their length and/or the conductive lines which may be narrowed where the conductive lines interconnect could be conductive lines that are substantially straight.

According to particular embodiments, reducing the width of the conductive lines in the respective electrode patterns in the two electrode layers where the conductive lines cross over may reduce visible reductions in display brightness at the interconnections. Such reductions in display brightness may be visible where constant width conductive lines cross over as there may be a concentration of conductive metal at the cross over point. Reducing the width of the conductive lines where the conductive lines cross over may make the distribution of the conductive metal across a touch position sensing panel more even, reducing the visibility of differences in display brightness.

Figure 5:
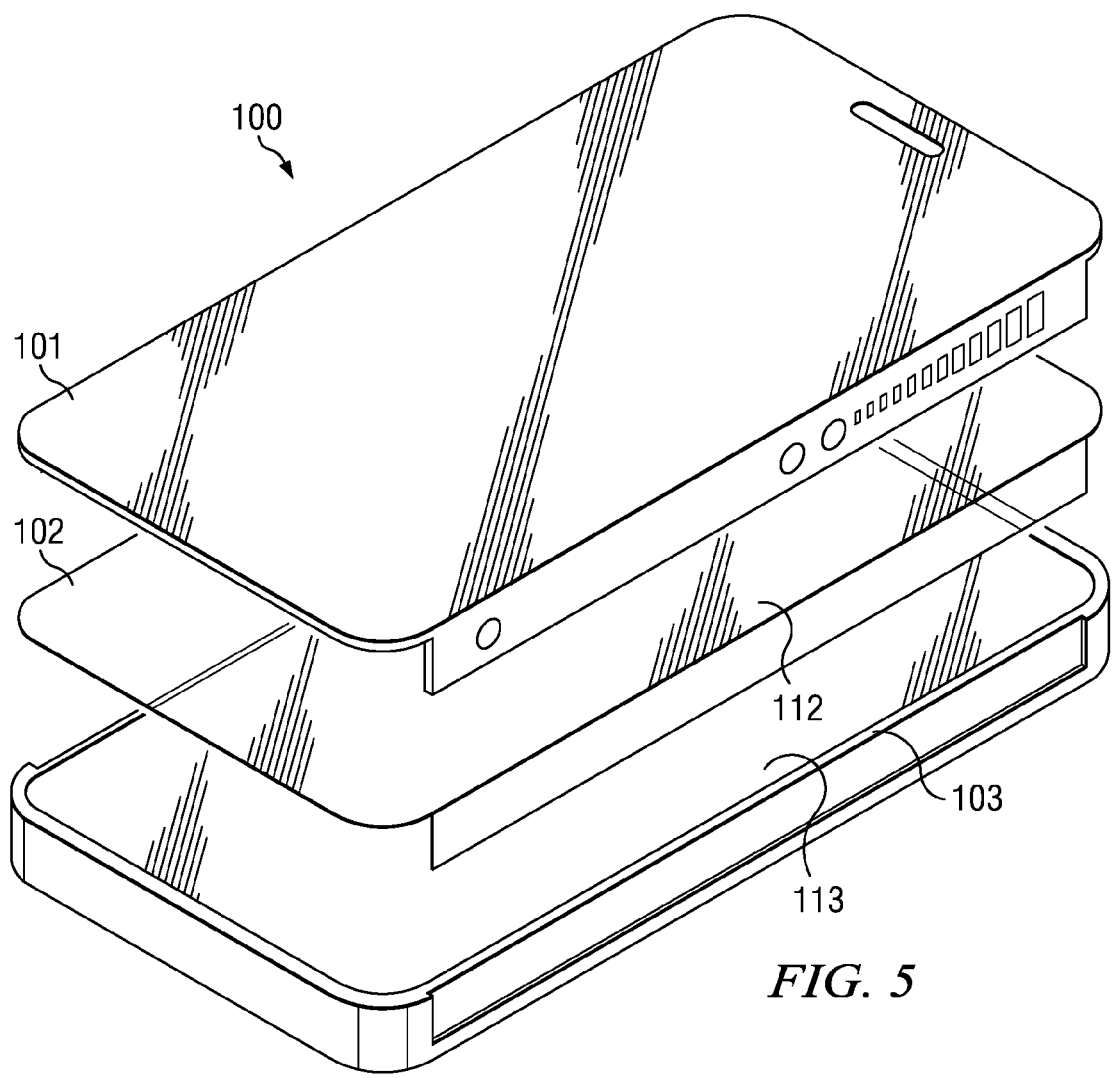
FIG. 5 illustrates an example mobile telephone that incorporates a touch sensor with conductive lines having portions with different widths.

FIG. 5 illustrates an example mobile telephone that incorporates a touch sensor with conductive lines having portions with different widths. In the example of FIG. 5, example mobile telephone 100 incorporates a touch-sensitive apparatus 112 wrapped around an example display 113. Substrate 102 may include or have attached to it tracking areas, which may include tracks providing drive and sense connections to and from the drive and sense electrodes of touch-sensitive apparatus 112. In particular embodiments, an electrode pattern of touch-sensitive apparatus 112 is made from metal-mesh technology with a copper, silver, or other suitable metal mesh, as described above. Substrate 102 may have the electrode pattern disposed on a surface. Substrate 102 and the conductive material of the electrode pattern may be flexible, enabling the conductive material to wrap around the left and right edges of the surface to left-side and right-side surfaces. For sharper edges (e.g., with radii of less than 1 mm), the flexible conductive material of the electrode pattern may be thicker or wider at the sharper edges than at the flat portions of surfaces. In particular embodiments, the electrode pattern may wrap around an edge 103 of example mobile phone 100. In other particular embodiments, touch-sensitive apparatus 112 may be wrapped around a curved surface. The curved surface may be curved in one dimension or in two dimensions. As an example and not by way of limitation, touch-sensitive apparatus 112 may be wrapped over surfaces that are substantially perpendicular to each other or, if there is no substantial distinction between surfaces (such as, for example, a pebble-shaped or curved device), an angle of deviation between the surfaces of 45° or greater. Although this disclosure describes and illustrates a particular use of touch-sensitive apparatus 112 in a particular device, this disclosure contemplates any suitable use of touch-sensitive apparatus 112 in any suitable device.

Example display 113 may be a liquid crystal display (LCD), a light-emitting diode (LED) display, an LED-backlight LCD, or other suitable display and may be visible though cover panel 101 and substrate 102, as well as the electrode pattern disposed on substrate 102. Although this disclosure describes and illustrates a particular display and particular display types, this disclosure contemplates any suitable device display and any suitable display types.

Herein, reference to a computer-readable storage medium or media may include one or more semiconductor-based or other integrated circuits (ICs) (such, as for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy disks, floppy disk drives (FDDs), magnetic tapes, holographic storage media, solid-state drives (SSDs), RAM-drives, SECURE DIGITAL cards, SECURE DIGITAL drives, or any other suitable computer-readable storage medium or media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
   a touch sensor comprising a first electrode, the first electrode comprising a mesh of conductive lines, the mesh comprising a plurality of first conductive lines and a plurality of second conductive lines, the plurality of first conductive lines and the plurality of second conductive lines of the mesh of the first electrode being disposed on a first layer of a substrate, wherein at least one of the first conductive lines of the mesh of the first electrode electrically contacts one of the second conductive lines of the mesh of the first electrode at an intersection;
   wherein a particular first conductive line of the mesh of the first electrode on the first layer of the substrate comprises a first portion, a second portion, and a third portion, the first and third portions being wider than the second portion;
   wherein a particular second conductive line of the mesh of the first electrode on the first layer of the substrate comprises a fourth portion, a fifth portion, and a sixth portion, the fourth and sixth portions being wider than the fifth portion;
   wherein the wider portions of the particular first and second conductive lines of the mesh of the first electrode on the first layer of the substrate define portions of outer edges of the first electrode; and
   one or more computer-readable non-transitory storage media coupled to the touch sensor and embodying logic that is configured when executed to control the touch sensor.

2. The apparatus of claim 1, wherein the touch sensor further comprises a second electrode, the first electrode being disposed on a first surface of the substrate and the second electrode being disposed on a second surface of the substrate opposite the first surface.

3. The apparatus of claim 1, wherein the touch sensor further comprises a second electrode, the first electrode being disposed on a surface of the substrate and the second electrode being disposed on a surface of a second substrate.

4. The apparatus of claim 1, wherein each of the first and second conductive lines of the mesh of conductive lines of the first electrode is a substantially straight line.

5. A touch sensor comprising:
   a first electrode comprising a mesh of conductive lines, the mesh comprising a plurality of first conductive lines and a plurality of second conductive lines, the plurality of first conductive lines and the plurality of second conductive lines of the mesh of the first electrode being disposed on a first layer of a substrate, at least one of the first conductive lines of the mesh of the first electrode electrically contacting one of the second conductive lines of the mesh of the first electrode at an intersection, wherein:
   a particular first conductive line of the mesh of the first electrode on the first layer of the substrate comprises a first portion, a second portion, and a third portion, the first and third portions being wider than the second portion;
   a particular second conductive line of the mesh of the first electrode on the first layer of the substrate comprises a fourth portion, a fifth portion, and a sixth portion, the fourth and sixth portions being wider than the fifth portion; and
   the wider portions of the particular first and second conductive lines of the mesh of the first electrode on the first layer of the substrate define portions of one or more outer edges of the first electrode.

6. The touch sensor of claim 5, wherein the touch sensor further comprises a second electrode, the first electrode being disposed on a first surface of the substrate and the second electrode being disposed on a second surface of the substrate opposite the first surface.

7. The touch sensor of claim 5, wherein the touch sensor further comprises a second electrode, the first electrode being disposed on a surface of the substrate and the second electrode being disposed on a surface of a second substrate.

8. The touch sensor of claim 5, wherein each of the first and second conductive lines of the mesh of conductive lines of the first electrode is a substantially straight line.

9. The touch sensor of claim 5, wherein the mesh of conductive lines of the first electrode is made from one of copper, silver, a copper-based material, or a silver-based material.

10. A touch sensor comprising:
    a substrate; and
    a first electrode comprising a mesh of conductive lines, the mesh comprising a plurality of first conductive lines and a plurality of second conductive lines, the plurality of first conductive lines and the plurality of second conductive lines of the mesh of the first electrode being disposed on a first layer of the substrate, at least one of the first conductive lines of the mesh of the first electrode electrically contacting one of the second conductive lines of the mesh of the first electrode at an intersection, wherein:
    a particular first conductive line of the mesh of the first electrode on the first layer of the substrate comprises a first portion, a second portion, and a third portion, the first and third portions being wider than the second portion;
    a particular second conductive line of the mesh of the first electrode on the first layer of the substrate comprises a fourth portion, a fifth portion, and a sixth portion, the fourth and sixth portions being wider than the fifth portion; and
    the wider portions of the particular first and second conductive lines of the mesh of the first electrode on the first layer of the substrate define portions of one or more outer edges of the first electrode.

11. The touch sensor of claim 10, further comprising a second electrode, the first electrode being disposed on a first surface of the substrate and the second electrode being disposed on a second surface of the substrate opposite the first surface.

12. The touch sensor of claim 10, further comprising a second electrode, the first electrode being disposed on a surface of the substrate and the second electrode being disposed on a surface of a second substrate.

13. The touch sensor of claim 10, wherein each of the first and second conductive lines of the mesh of conductive lines of the first electrode is a substantially straight line.

14. The touch sensor of claim 10, wherein the mesh of conductive lines of the first electrode is made from one of copper, silver, a copper-based material, or a silver-based material.

* * * * *